United States Patent [19]

Aoki

[11] Patent Number: 4,752,744
[45] Date of Patent: Jun. 21, 1988

[54] BALANCED TRANSFORMER-LESS AMPLIFIER CIRCUIT

[75] Inventor: Hidehiko Aoki, Yokohama, Japan

[73] Assignee: Kabushiki Kaisha Toshiba, Kawasaki, Japan

[21] Appl. No.: 58,132

[22] Filed: Jun. 4, 1987

[30] Foreign Application Priority Data

Jun. 6, 1986 [JP] Japan ................. 61-131226

[51] Int. Cl.⁴ ............................................. H03F 3/45
[52] U.S. Cl. ...................................... 330/252; 330/85; 330/258; 330/260
[58] Field of Search ..................... 330/9, 85, 252, 258, 330/260, 295, 310, 311

[56] References Cited

U.S. PATENT DOCUMENTS 4,698,599 10/1987 Hedman ............................. 330/252

Primary Examiner—Eugene R. LaRoche
Assistant Examiner—Steven J. Mottola
Attorney, Agent, or Firm—Finnegan, Henderson, Farabow, Garrett & Dunner

[57] ABSTRACT

A balanced transformer-less amplifier having a pair of power amplifers connected in parallel for outputting amplified signals of opposite polarity, offset output detection circuit coupled to the amplifiers for detecting the difference in voltage level between the outputs of the two power amplifiers, and a preamplifier responsive to the offset output detection circuit both for operating the pair of power amplifiers on only a single power source voltage and for compensating for the difference in voltage level between the outputs of the two power amplifiers.

10 Claims, 4 Drawing Sheets

BALANCED TRANSFORMER-LESS AMPLIFIER CIRCUIT

BACKGROUND OF THE INVENTION

1. Field of the Invention

This invention relates to a balanced transformer-less amplifier circuit and, more particularly, to a balanced transformer-less amplifier circuit suitable for battery operation.

2. Description of the Prior Art

Balanced transformer-less amplifier circuits are able to supply a relatively large power output with a low supply voltage. Therefore, the balanced transformer-less amplifier circuits are widely used as power amplifiers of battery operated equipment, such as portable radios, portable tape players/recorders and the like. The balanced transformer-less amplifier circuits have a preamplifier circuit and a pair of power amplifier circuits which are coupled to the output terminal of the preamplifier circuit in parallel with each other. The pair of power amplifier circuits are so designed that their outputs have opposite polarities to each other. That is, one of the power amplifiers operates as a non-inversed output amplifier, while the other power amplifier operates as an inversed output amplifier.

Recently, amplifiers including the balanced transformer-less amplifier circuits have been fabricated into forms of integrated circuits (referred as ICs hereafter). As is well known, the ICs are required to have capacitors as low a capacitance as possible, since the capacitors occupy a huge area on the IC chips. On the other hand, loads such as loudspeakers generally are coupled to amplifiers therefor, via suitable filter circuits for preventing DC (direct current) currents from flowing through the loads. The filter circuits conventionally are comprised of capacitors with large capacitance. Therefore, the amplifiers generally are fabricated into the IC configurations without including the coupling capacitors therein. Then the loads are coupled to the amplifiers of the IC forms, via coupling capacitors outside the amplifiers in the IC forms.

The balanced transformer-less amplifier circuits are suitable for the amplifiers in the IC forms for driving these loads. This is because the balanced transformer-less amplifier circuits are able to be coupled to the loads without using the coupling capacitors. For the conventional balanced transformer-less amplifier circuits, a reference is made to the non-examined Japanese Patent Publication No. 53-129569.

Although the above mentioned Patent Publication fails to disclose all the details of the balanced transformer-less amplifier circuit, it is well known that this type of the balanced transformer-less amplifier circuit is driven by a power supply circuit with a positive and a negative voltage source. The positive and negative voltage sources make it possible for both of the DC output levels of the pair of power amplifiers to be kept at the same levels of the zero potential. As a result, loads therefor can be coupled between the output terminals of the pair of power amplifiers without using coupling capacitors.

FIG. 1 shows an example of the conventional balanced transformer-less amplifier circuits corresponding to the above-referenced Patent Publication. In FIG. 1, a balanced transformer-less amplifier circuit 10 has a preamplifier 11, a pair of power amplifiers, i.e., first and second power amplifiers 12, 13 and a circuit 14 for detecting an offset output voltage, as described later. The preamplifier 11 is constituted by first and second PNP transistors 15, 16. The emitter-collector paths of the first and second PNP transistors 15, 16 are connected between first and second power supply terminals 17, 18 in parallel with each other. The first and second power supply terminals 17, 18 are adapted for receiving prescribed positive and negative voltages +Vcc, −Vee, respectively.

The emitters of the first and second PNP transistors 15, 16 are connected to the positive power supply terminal 17 through current sources 19, 20, respectively. The collectors of the first and second PNP transistors 15, 16 are connected to the negative power supply terminal 18 through collector load resistors 21, 22, respectively. The base of the first PNP transistor 15 is coupled to an input signal reception terminal 23. The input reception terminal 23 is adapted for receiving an input signal to be amplified in the balanced transformer-less amplifier circuit 10. The base of the second PNP transistor 16 is coupled to the output terminal of the offset output voltage detecting circuit 14. Further the bases of the first and second PNP transistors 15, 16 are connected to a ground terminal 24 through base bias resistors 25, 26, respectively. The ground terminal 24 is adapted for a connection to a ground potential source 27.

The first and second power amplifiers 12, 13 are constituted by non-inversed amplifiers, respectively. The input terminals of the first and second power amplifiers 12, 13 are coupled to the collectors of the second and first PNP transistors 16, 15, respectively. The output terminals of the first and second power amplifiers 12, 13 are coupled to first and second output signal supply terminals 28, 29 of the balanced transformer-less amplifier circuit 10. The first and second output signal supply terminals 28, 29 are adapted for supplying a prescribed load such as a loudspeaker 30 with the output of the balanced transformer-less amplifier circuit 10, i.e., a differential output between the first and second output signal supply terminals 28, 29. The load 30 is coupled between the first and second output signal supply terminals 28, 29. The output terminals of the first and second power amplifiers 12, 13 are further coupled to the emitters of the first and second PNP transistors 15, 16 through feedback resistors 31, 32, respectively. Therefore, the input terminal of the first power amplifier 12 is connected to the second PNP transistor 16, but its output terminal is connected to the first PNP transistor 15. The input terminal of the second power amplifier 13 is connected to the first PNP transistor 15, but its output terminal is connected to the second PNP transistor 16. Further, the emitters of the first and second PNP transistors 15, 16 are coupled to each other through a common-emitter resistor 33. Therefore, the first and second power amplifiers 12, 13 of the preamplifier 11 are connected to each other in a differential amplifier configuration. The common-emitter resistor 33 further determines the gain of the balanced transformer-less amplifier circuit 10 together with the feedback resistors 31, 32.

The offset output voltage detecting circuit 14 is constituted by a differential amplifier with both an inversed and a non-inversed input terminal. The inversed and non-inversed input terminals of the offset output voltage detecting circuit 14 are connected to the first and second output signal supply terminals 28, 29, respectively. Thus, the outputs on the first and second output signal supply terminals 28, 29 are applied to the inversed and non-inversed input terminals of the offset output voltage detecting circuit 14. Here, the DC levels of the outputs on the first and second output signal supply terminals 28, 29 are offset from each other in the practical circuit structure due to unbalances between corresponding circuit elements or the like. The offset output voltage detecting circuit 14 detects the difference between the DC levels of the outputs, i.e., the offset output voltage. The output terminal of the offset output voltage detecting circuit 14 is connected to the base of the second PNP transistor 16. A prescribed terminal of the offset output voltage detecting circuit 14 is further coupled to a terminal 34. The terminal 34 is adapted for coupling to the ground potential source 27 through a capacitor 35.

As is mentioned above, the prior art balanced transformer-less amplifier circuit needs both a positive and a negative power supply voltage source, i.e., the positive and negative voltages $+Vcc$, $-Vee$. However, battery operated portable equipment should have a power supply voltage source which is as simple as possible. In this connection, the use of the two power supply voltage sources, i.e., the positive and negative voltage sources, is extremely undesirable for battery operated portable equipment.

Here, if the prior art balanced transformer-less amplifier circuit was modified so that the terminal 18 was connected to the ground potential source 27 instead of the source of the negative voltage $-Vee$, the prior art balanced transformer-less amplifier circuit could be operated with only the positive power source voltage $+Vcc$. In this case, the offset output voltage detecting circuit 14 would be able to detect the offset output voltage between the first and second output signal supply terminals 28, 29 when the offset output voltage was positive. However, the output potential of the offset output voltage detecting circuit 14 does not go below the ground potential. As a result, the offset output voltage detecting circuit 14 fails to operate when the offset output voltage is negative. Thus, the prior art balanced transformer-less amplifier circuit would fail to compensate completely for the offset output voltage, if the prior art balanced transformer-less amplifier circuit were modified, as mentioned above.

SUMMARY OF THE INVENTION

An object of the present invention is to provide a balanced transformer-less amplifier circuit which is able to operate from a single power supply voltage source.

Another object of the present invention is to provide a balanced transformer-less amplifier circuit which is suitable for battery operation.

A further object of the present invention is to provide a balanced transformer-less amplifier circuit which can be coupled to loads without using coupling capacitors.

These and other objects are achieved in the balanced transformer-less amplifier circuit of the present invention which includes a pair of power amplifiers connected in parallel for outputting amplified signals of opposite polarity, offset output detection circuit coupled to the amplifiers for detecting the difference in voltage level between the outputs of the two power amplifiers, and a preamplifier responsive to the offset output detection circuit both for operating the pair of power amplifiers on only a single power source voltage and for compensating for the difference in voltage level between the outputs of the two power amplifiers.

Additional objects, advantages, and features of the present invention will become apparent to persons skilled in the art from a study of the following description and of the accompanying drawings, in which:

DESCRIPTION OF THE PREFERRED EMBODIMENTS

Figure 1:
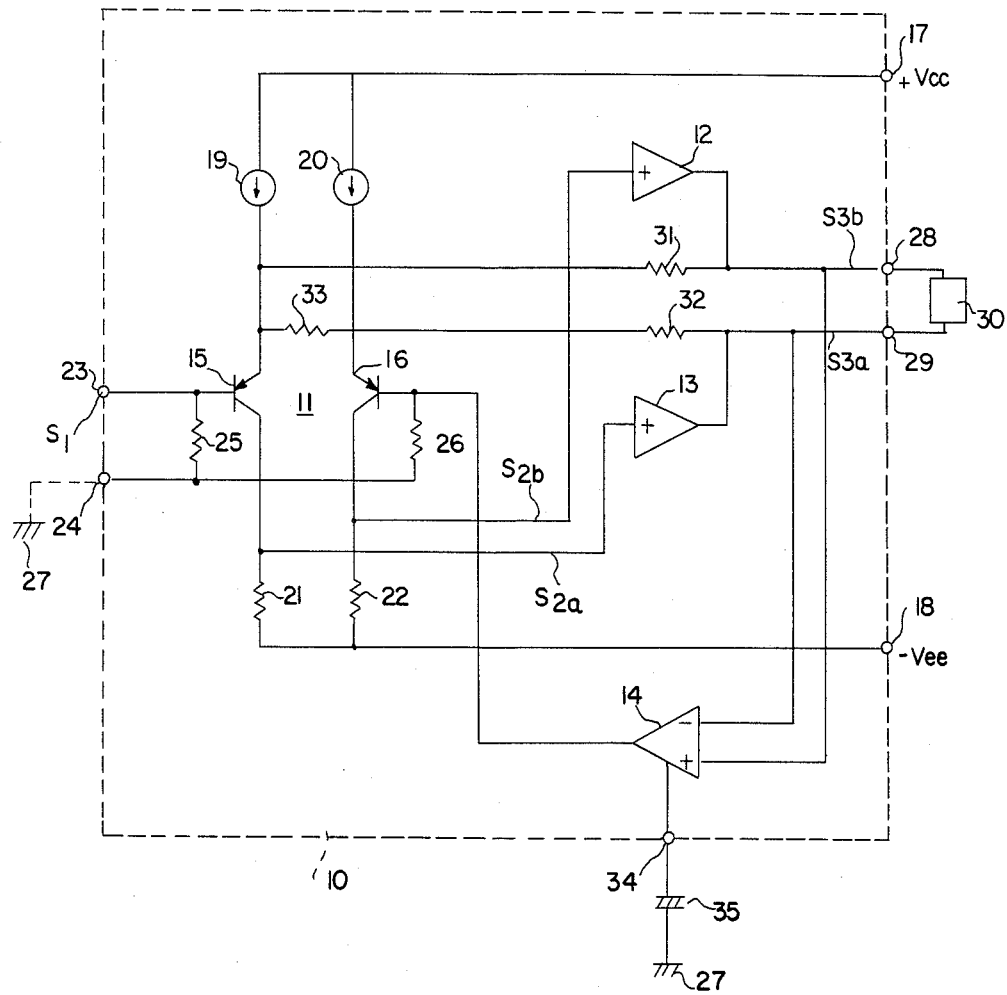
FIG. 1 is a block diagram showing an example of a conventional balanced transformer-less amplifier circuit.

The present invention will now be described in detail with reference to the accompanying drawings, namely, FIGS. 2 to 4. Throughout the drawings, like reference numerals and letters used in FIG. 1 for the prior art balanced transformer-less amplifier circuit are also used to designate like or equivalent elements for the sake of simplicity of explanation.

Figure 2:
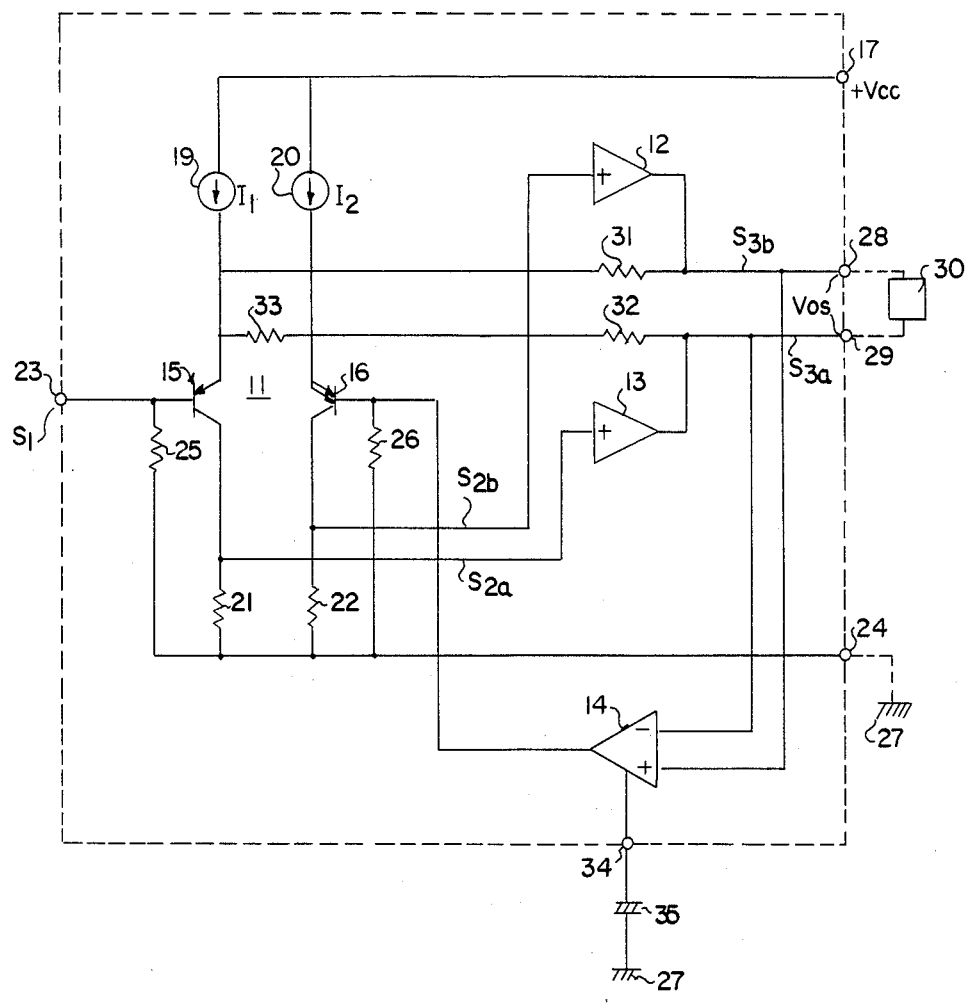
FIG. 2 is a block diagram showing an embodiment of the balanced transformer-less amplifier circuit according to the present invention.

Referring now to FIG. 2, there is shown a balanced transformer-less amplifier circuit 10 embodying the present invention. Like the conventional circuits, the balanced transformer-less amplifier has a preamplifier 11, a pair of power amplifiers, i.e., first and second power amplifiers 12, 13 and an offset output voltage detecting circuit 14 for detecting an offset output voltage, as described later. The preamplifier 11 is constituted by first and second PNP transistors 15, 16. Further, the first and second PNP transistors 15, 16 are related with each other in that the second PNP transistor 16 has an emitter current dencity a half times of the emitter current dencity of the first PNP transistor 15. For example, the first and second PNP transistors 15, 16 are related with each other in that the emitter of the second PNP transistor 16 has an area two times larger than the emitter of the first PNP transistor 15. The emitter-collector paths of the first and second PNP transistors 15, 16 are connected between a power supply terminal 17 and a ground terminal 24 in parallel with each other. The ground terminal 24 is adapted for a connection to a ground potential source 27. The power supply terminal 17 is adapted for receiving a prescribed positivie voltage $+Vcc$.

The emitters of the first and second PNP transistors 15, 16 are connected to the positive power supply terminal 17 through current sources 19, 20, respectively. The collectors of the first and second PNP transistors 15, 16 are connected to the ground terminal 24 through collector load resistors 21, 22, respectively. The base of the first PNP transistor 15 is coupled to an input signal reception terminal 23. The input signal reception terminal 23 is adapted for receiving an input signal to be amplified in the balanced transformer-less amplifier circuit 10. The base of the second PNP transistor 15 is coupled to the output terminal of the offset output voltage detecting circuit 14. Further the bases of the transistors 15, 16 are connected to the ground terminal 24 through base bias resistors 25, 26, respectively.

The first and second power amplifiers 12, 13 are constituted by non-inversed amplifiers, respectively. The input terminals of the first and second power amplifiers 12, 13 are coupled to the collectors of the second and first PNP transistors 16, 15, respectively. The output terminals of the first and second power amplifiers 12, 13 are coupled to the first and second output signal supply terminals 28, 29 of the balanced transformer-less amplifier circuit 10. The first and second output signal supply terminals 28, 29 are adapted for supplying a prescribed load such as a loudspeaker 30 with the output of the balanced transformer-less amplifier circuit 10, i.e., a differential output between the first and second output signal supply terminals 28, 29. The load 30 is coupled between the first and second output signal supply terminals 28, 29. The output terminals of the first and second power amplifiers 12, 13 are further coupled to the emitters of the first and second PNP transistors 15, 16 through feedback resistors 31, 32, respectively. Therefore, the input terminal of the first power amplifier 12 is connected to the second PNP transistor 16, and its output terminal is connected to the first PNP transistor 15. The input terminal of the second power amplifier 13 is connected to the first PNP transistor 15, and its output terminal is connected to the second PNP transistor 16. Further, the emitters of the first and second PNP transistors 15, 16 are coupled to each other through a commom-emitter resistor 33. Therefore, the first and second power amplifiers 12, 13 of the preamplifier 11 are connected to each other in a differential amplifier configuration. The commom-emitter resistor 33 further determines the gain of the balanced transformer-less amplifier circuit 10 together with the feedback resistors 31, 32.

The offset output voltage detecting circuit 14 is constituted by a differential amplifier with both an inversed and a non-inversed input terminal. The inversed and non-inversed input terminals of the offset output voltage detecting circuit 14 are connected to the first and second output signal supply terminals 28, 29, respectively. Here, the DC levels of the outputs on the first and second output signal supply terminals 28, 29 are offset from each other in the practical circuit structure due to unbalances between corresponding circuit elements or the like. The offset output voltage detecting circuit 14 detects the difference between the DC levels of the outputs, i.e., the offset output voltage. The output terminal of the offset output voltage detecting circuit 14 is connected to the base of the second PNP transistor 16. A prescribed terminal of the offset output voltage detecting circuit 14 is further coupled its prescribed terminal to a terminal 34. The terminal 34 is adapted for coupling to the ground potential source 27 through a capacitor 35.

The operation of the balanced transformer-less amplifier circuit 10 shown in FIG. 2 will now be described in more detail. An input signal, for example, an audio signal S1 is applied to the base of the first PNP transistor 15 through the input signal reception terminal 23. The preamplifier 11 amplifies the input signal S1 due to its differential amplifying operation. Thus, two amplified signals S2a, S2b with phases opposite to each other arise across the collector load resistors 21, 22, respectively. The signals S2a, S2b are applied to the second and first power amplifiers 13, 12, respectively. The second and first power amplifiers 13, 12 amplify the signals S2a, S2b by their power amplifying operations. Thus, two power-amplified signals S3a, S3b arise on the second and first output signal supply terminals 29, 28, respectively. Thus, the signals S3a, S3b on the second and first output signal supply terminals 29, 28 also are related in opposite phases to each other. That is, the signal S3a has a non-inversed phase in relation to the signal S1, while, the signal S3b has an inversed phase in relation to the signal S1. The signals S3a, S3b are applied to the load 30 and drive the load 30. The signals S3a, S3b are fed back to the collectors of the second and first PNP transistors 16, 15 through the feedback resistors 32, 31, respectively. Thus, the gain G of the balanced transformer-less amplifier circuit 10 is given by an equation of G=(R31+R32)/R33, wherein R31, R32 and R33 are resistances of the resistors 31, 32 and 33. In the conventional manner, respective pairs of corresponding circuit elements, i.e., the pair of current mirrors 19, 20, the pair of collector load resistors 21, 22, the pair of base bias resistors 25, 26 and the pair of feedback resistors 31, 32 are set to have the same value with each other. For example, the resistances R31, R32 of the feedback resistors 31, 32 have the same resistance represented by R31. Therefore, the above equation is written as follows, i.e., G=2 R31/R33.

The signals S3a, S3b on the second and first output signal supply terminals 29, 28 also are applied to the inversed and non-inversed input terminals of the offset output voltage detecting circuit 14. The offset output voltage detecting circuit 14 detects the offset output voltage Vos between the first and second output signal supply terminals 28, 29. The Vos arises on the output terminal of the offset output voltage detecting circuit 14. AC (alternating current) components of the signals S3a, S3b flow to the ground potential source 27 through the terminal 34 and the capacitor 35 so that the AC components are removed from the output of the offset output voltage detecting circuit 14. Thus, only the DC component of the output of the offset output voltage detecting circuit 14, i.e., the offset output voltage Vos, is obtained on the output terminal of the offset output voltage detecting circuit 14. The offset output voltage Vos is applied to the base of the second PNP transistor 16.

The first and second PNP transistors 15, 16 are related with each other in that the second PNP transistor 16 has an emitter current dencity a half times smaller than the emitter current dencity of the first PNP transistor 15. That is, the second PNP transistor 16 has an emitter area two times larger than that of the first PNP transistor 15, as described above. As is well known, the base emitter voltage of a transistor is given by $Vt \cdot Ln(Ic/Is)$, wherein Vt is the thermal voltage, Ln is the natural logarithm, Ic is the collector current of transistors and Is is the reverse direction saturation current of the transistor. Thus, the base emitter voltage Vbe15, Vbe16 of the first and second PNP transistors 15, 16 are given as follows:

$$Vbe15 = Vt\ Ln(Ic15/Is15)$$

$$Vbe16 = Vt \cdot Ln(Ic16/Is16)$$

Thus, the base potential Vb16 of the second PNP transistor 16 becomes as follows:

$$Vb16 = Vbe16 - Vbe15 \quad (1)$$
$$= Vt \cdot Ln(Ic16/Is16) - Vt \cdot Ln(Ic15/Is15)$$
$$= Vt \cdot Ln(Ic16/Ic15) \cdot (Is16/Is15)$$

For identical transistors, Is15 and Is16 are equal, and the equation (1) becomes;

$$Vb16 = Vt \cdot Ln(Ic16/Ic15) \quad (2)$$

The emitter area of the second PNP transistor 16 is two times that of the first PNP transistor 15, as described above, so that the collector current Ic16 also is two times the collector current Ic15. Thus, the equation (2) becomes;

$$Vb16 = Vt \cdot Ln(2Ic15/Ic15) = Vt \cdot Ln2 \quad (3)$$

For example, Vt has a value of about +26 mV at the normal temperature of 27° C. (or 300° K.), and the Ln2 has a value of 0.7. Then, Vb16 of the second PNP transistor 16 has a value of +18 mV at a temperature of 27° C.

The output terminal of the offset output voltage detecting circuit 14 is coupled to the base of the second PNP transistor 16, so that the offset output voltage Vos detected by the offset output voltage detecting circuit 14 is added to the base voltage Vb16 of the second PNP transistor 16. The potential Vp on the base of the second PNP transistor 16 or the output terminal of the offset output voltage detecting circuit 14 is kept to the value of +18 mV in a static state because the offset output voltage Vos is zero. The potential Vp on the base of the second PNP transistor 16 is able to increase or decrease from the value of +18 mV as a standard when the offset output voltage Vos becomes positive or negative. The Vp is given by the equation of Vp=Vb16+Vos.

In practical circuit design, DC levels V28, V29 on the first and second output signal supply terminals 28, 29 are so designed as to have a standard or center value of potential equal to about half of the power source voltage +Vcc as. When the +Vcc is +3 V, the DC levels V28, V29 are about +1.5 V. Emitter potentials Ve15, Ve16 of the first and second PNP transistors 15, 16 are automatically set to have the potential, e.g., +1.5 V according to the potential, i.e., the DC level V28 or V29 on the first and second output signal supply terminals 28, 29.

When the DC level V28 on the first output signal supply terminal 28 is higher than its standard value, e.g., 1.5 V, the DC level V29 on the second output signal supply terminal 29 is below the standard value, e.g., 1.5 V, and varies inversely with the DC level V28. Thus, some amount of positive offset output voltage +Vos arises between the first and second output signal supply terminals 28, 29. In this state, the emitter potential Ve15 of the first PNP transistor 15 also is above the standard potential, e.g., +1.5 V, while, the emitter potential Ve16 of the second PNP transistor 16 is below the standard potential, e.g., +1.5 V. The positive offset output voltage +Vos is detected by the offset output voltage detecting circuit 14 and is applied to the base of the second PNP transistor 16. The potential Vp increases over its standard value, e.g., 18 mV, by the positive offset output voltage +Vos. Then, the second PNP transistor 16 is more activated to increase the current Ic16 which flows through the second PNP transistor 16. The voltage V22 across the resistor 22 increases, so that the emitter potential Ve16 of the second PNP transistor 16 rises to approach the standard potential, e.g., +1.5 V. As a result of this operation, the DC level V29 on the second output signal supply terminal 29 automatically rises to approach the standard potential, e.g., +1.5 V, according to the increase of the emitter potential Ve16 of the second PNP transistor 16. The emitter potential Ve15 of the first PNP transistor 15 automatically lowers to approach the standard potential, e.g., +1.5 V, inversely to the operation for the second PNP transistor 16 due to the positive offset output voltage +Vos. The DC level V28 on the first output signal supply terminal 28 also automatically loewrs to approach the standard potential, e.g., +1.5 V according to the decrease of the emitter potential Ve15 of the first PNP transistor 15. As a result, the positive offset output voltage +Vos arising between the first and second output signal supply terminals 28 and 29 is eliminated.

When the DC level V28 on the first output signal supply terminal 28 is lower than its standard value, e.g., 1.5 V, the DC level V29 on the second output signal supply terminal 29 is above the standard value, e.g., 1.5 V in inverse relation to the DC level V28. Thus, some amount of negative offset output voltage −Vos arises between the first and second output signal supply terminals 28, 29. In this state, the emitter potential Ve15 of the first PNP transistor 15 also is below the standard potential, e.g., +1.5 V, while, the emitter potential Ve16 of the second PNP transistor 16 is above the standard potential, e.g., +1.5 V. The negative offset output voltage −Vos is detected by the offset output voltage detecting circuit 14 and applied to the base of the second PNP transistor 16. The potential Vp decreases below its standard value, e.g., 18 mV by the negative offset output voltage −Vos. Then, the second PNP transistor 16 is less conductive and the current Ic16 is decreased. The voltage V22 across the resistor 22 decreases so that the emitter potential Ve16 of the second PNP transistor 16 lowers to approach the standard potential, e.g., +1.5 V. As a result of this operation, the DC level V29 on the second output signal supply terminal 29 automatically lowers to approach the standard potential, e.g., +1.5 V, according to the decrease of the emitter potential Ve16 of the second PNP transistor 16. The emitter potential Ve15 of the first PNP transistor 15 automatically rises to approach the standard potential, e.g., +1.5 V, inversely to the operation for the second PNP transistor 16 due to the negative offset output voltage −Vos. The DC level V28 on the first output signal supply terminal 28 also automatically rises to approach the standard potential, e.g., +1.5 V according to the increase of the emitter potential Ve15 of the first PNP transistor 15. As a result, the positive offset output voltage −Vos arising between the first output signal supply terminal 28 and 29 is eliminated.

Thus, the offset output voltage detecting circuit 14 is able to eliminate both the positive and negative offset output voltages +Vos and −Vos arising between the first and second output signal supply terminals 28 and 29. The DC levels V28, V29 on the first and second output signal supply terminals 28, 29 are effectively compensated to maintain the same standard potential, e.g., +1.5 V. The offset output voltage detecting circuit 14 is able to detect the negative offset output voltages −Vos, as well as the positive offset output voltages +Vos.

Figure 3:
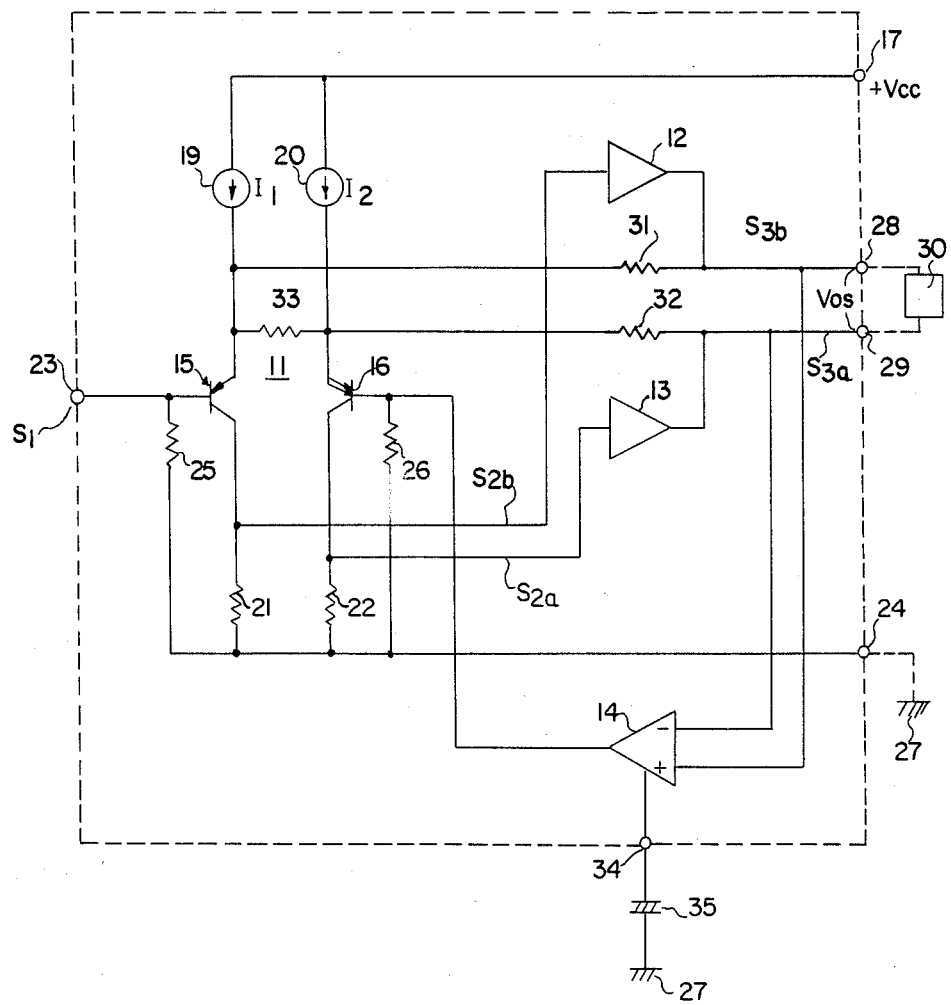
FIG. 3 is a block diagram showing a modification of the balanced transformer-less amplifier circuit of FIG. 2.

Referring now to FIG. 3, a modification of the balanced transformer-less amplifier circuit of FIG. 2 will be described. The modification of the balanced transformer-less amplifier also has a preamplifier 11, a pair of power amplifiers, i.e., first and second power amplifiers 12, 13 and a circuit offset output voltage detecting circuit 14 for detecting an offset output voltage, as described later. The preamplifier 11 is constituted by first and second PNP transistors 15, 16. Further, the first and second PNP transistors 15, 16 are related with each other in that the emitter of the second PNP transistor 16 has the area two times larger than the emitter of the first PNP transistor 15. The emitter-collector paths of the first and second PNP transistors 15, 16 are connected between a power supply terminal 17 and a ground terminal 24 in parallel with each other. The ground terminal 24 is adapted for a connection to a ground potential source 27. The power supply terminal 17 is adapted for receiving a prescribed positive voltage +Vcc.

The emitters of the first and second PNP transistors 15, 16 are connected to the positive power supply terminal 17 through current sources 19, 20, respectively. The collectors of the first and second PNP transistors 15, 16 are connected to the ground terminal 24 through collector load resistors 21, 22, respectively. The base of the first PNP transistor 15 is coupled to an input signal reception terminal 23. The input signal reception terminal 23 is adapted for receiving an input signal to be amplified in the balanced transformer-less amplifier circuit 10. The base of the second PNP transistor 15 is coupled to the output terminal of the offset output voltage detecting circuit 14. Further the bases of the transistors 15, 16 are connected to the ground terminal 24 through base bias resistors 25, 26, respectively.

The first and second power amplifiers 12, 13 are constituted by inversed amplifiers, respectively, as opposed to the non-inversed amplifiers in the balanced transformer-less amplifier circuit of FIG. 2. The input terminals of the first and second power amplifiers 12, 13 are coupled to the collectors of the first and second PNP transistors 15, 16, respectively. The output terminals of the first and second power amplifiers 12, 13 are coupled to first and second output signal supply terminals 28, 29 of the balanced transformer-less amplifier circuit 10. The first and second output signal supply terminals 28, 29 are adapted for supplying a prescribed load such as a loudspeaker 30 with the output of the balanced transformer-less amplifier circuit 10, i.e., a differential output between the first and second output signal supply terminals 28, 29. The load 30 is coupled between the first and second output signal supply terminals first and second output signal supply terminals 28, 29. The output terminals of the first and second power amplifiers 12, 13 are further coupled to the emitters of the first and second PNP transistors 15, 16 through feedback resistors 31, 32, respectively. Therefore, both the input and output terminals of the first power amplifier 12 are connected to the first PNP transistor 15. Similarly, both its input and output terminals of the second power amplifier 13 are connected to the first PNP transistor 15. Further, the emitters of the first and second PNP transistors 15, 16 are coupled to each other through a common-emitter resistor 33. Therefore, the first and second power amplifiers 12, 13 of the preamplifier 11 are connected to each other in a differential amplifier configuration. The common-emitter resistor 33 further determines the gain of the balanced transformer-less amplifier circuit 10 together with the feedback resistors 31, 32.

The offset output voltage detecting circuit 14 is constituted by a differential amplifier with both an inversed and a non-inversed input terminal. The inversed and non-inversed input terminals of the offset output voltage detecting circuit 14 are connected to the first and second output signal supply terminals 28, 29, respectively. Here, the DC levels of the outputs on the first and second output signal supply terminals 28, 29 are offset from each other in the practical circuit structure due to unbalances between corresponding circuit elements or the like. The offset output voltage detecting circuit 14 detects the difference between the DC levels of the outputs, i.e., the offset output voltage. The output terminal of the offset output voltage detecting circuit 14 is connected to the base of the second PNP transistor 16. A prescribed terminal of the offset output voltage detecting circuit 14 is further coupled to a terminal 34. The terminal 34 is adapted for coupling to the ground potential source 27 through a capacitor 35.

The operation of the balanced transformer-less amplifier circuit 10 shown in FIG. 3 will now be described in more detail. An input signal, for example, an audio signal S1 is applied to the base of the first PNP transistor 15 through the input signal reception terminal 23. The preamplifier 11 amplifies the signal S1 due to its differential amplifying operation. Thus, two amplified signals S2a, S2b with opposite phases to each other arise across the collector load resistors 21, 22, respectively. The signals S2a, S2b are applied to the first and second power amplifiers 12, 13, respectively. The first and second power amplifiers 12, 13 amplify the signals S2a, S2b by their power amplifying operations. Thus, two power-amplified signals S3a, S3b arise on the first and second output signal supply terminals 28, 29, respectively. The signals S3a, S3b on the first and second output signal supply terminals 28, 29 also are inversely related to each other in phase. That is, the signal S3a has the non-inversed phase in relation to the signal S1, while, the signal S3b has the inversed phase in relation to the signal S1. The signals S3a, S3b are applied to the load 30 and drive the load 30. The signals S3a, S3b are fed back to the collectors of the first and second PNP transistors 15, 16 through the 31, 32, respectively. Thus, the gain G of the balanced transformer-less amplifier circuit 10 is given by the equation of G=(R31+R32)/R33, wherein R31, R32 and R33 are resistances of the resistors 31, 32, and 33. In the conventional manner, respective pairs of corresponding circuit elements, i.e., the pair of current sources 19, 20, the pair of collector load resistors 21, 22, the pair of base bias resistors 25, 26 and the pair of feedback resistors 31, 32 are set to have the same value with each other. For example, the resistances R31, R32 of the feedback resistors 31, 32 have the same resistance represented by R31. Therefore, the above equation is written as follows, i.e., G=2 R31/R33.

The signals S3a, S3b on the first and second output signal supply terminals 28, 29 also are applied to the inversed and non-inversed input terminals of the offset output voltage detecting circuit 14. The offset output voltage detecting circuit 14 detects the offset output voltage Vos between the first and second output signal supply terminals 28, 29. The offset output voltage Vos arises on the output terminal of the offset output voltage detecting circuit 14. AC components of the signals S3a, S3b flow to the ground potential source 27 through the terminal 34 and the capacitor 35 so that the AC components are removed from the output of the offset output voltage detecting circuit 14. Thus, only the DC component of the output of the offset output voltage detecting circuit 14, i.e., the offset output voltage Vos, is obtained on the output terminal of the offset output voltage detecting circuit 14. The offset voltage Vos is applied to the base of the second PNP transistor 16.

The second PNP transistor 16 has an emitter area two times larger than that of the first PNP transistor 15, as described above. As is well known, the base emitter voltage of a transistor is given by Vt·Ln(Ic/Is), wherein Vt is the thermal voltage, Ln is the natural logarithm, Ic is the collector current and Is is the reverse direction saturation current of the transistor. Thus, the base emitter voltage Vbe15, Vbe16 of the first and second PNP transistors 15, 16 are given as follows:

$$Vbe15 = Vt \cdot Ln(Ic15/Is15)$$

$$Vbe16 = Vt \cdot Ln(Ic16/Is16)$$

Thus, the base potential Vb16 of the second PNP transistor 16 becomes as follows;

$$\begin{aligned} Vb16 &= Vbe16 - Vbe15 \\ &= Vt \cdot Ln(Ic16/Is16) - Vt \cdot Ln(Ic15/Is15) \\ &= Vt \cdot Ln(Ic16/Ic15) \cdot (Is16/Is15) \end{aligned} \quad (4)$$

For identical transistors, Is15 and Is16 are equal, and the equation (4) becomes;

$$Vb16 = Vt \cdot Ln(Ic16/Ic15) \quad (5)$$

The emitter area of the second PNP transistor 16 is two times that of the first PNP transistor 15, as described above, so that the current Ic16 also is two times the current Ic15. Thus, the equation (5) becomes;

$$Vb16 = Vt \cdot Ln(2Ic15/Ic15) = Vt \cdot Ln2 \quad (6)$$

For example, the thermal voltage Vt has a value of about +26 mV at the normal temperature of 27° C. (or 300° K.), and the Ln2 has the value of 0.7. Then, the Vb16 of the second PNP transistor 16 has a value of +18 mV at a temperature of 27° C.

The output terminal of the offset output voltage detecting circuit 14 is coupled to the base of the second PNP transistor 16, so that the offset output voltage Vos detected by the offset output voltage detecting circuit 14 is added to the base voltage Vb16 of the second PNP transistor 16. The potential Vp on the base of the second PNP transistor 16 or the output terminal of the offset output voltage detecting circuit 14 is kept to the value of +18 mV in a static state because the offset output voltage Vos is zero. The potential Vp on the base of the second PNP transistor 16 is able to increase or decrease from the value of +18 mV as a standard when the offset output voltage Vos becomes positive or negative. The Vp is given by the equation of Vp=Vb16+Vos.

In practical circuit design, DC levels V28, V29 on the first and second output signal supply terminals 28, 29 are so designed as to have a standard or center value of potential equal to about half of the power source voltage +Vcc. When the +Vcc is +3 V, the DC levels V28, V29 are about +1.5 V. Emitter potentials Ve15, Ve16 of the first and second PNP transistors 15, 16 are automatically set to have the potential, e.g., +1.5 V according to the potential, i.e., the DC level V28 or V29 on the first and second output signal supply terminals 28, 29.

When the DC level V28 on the first output signal supply terminal 28 is higher than its standard value, e.g., 1.5 V, the DC level V29 on the second output signal supply terminal 29 is below the standard value, e.g., 1.5 V, and varies inversely with the DC level V28. Thus, some amount of positive offset output voltage +Vos arises between the first and second output signal supply terminals 28, 29. In this state, the emitter potential Ve15 of the first PNP transistor 15 also is above the standard potential, e.g., +1.5 V, while, the emitter potential Ve16 of the second PNP transistor 16 is below the standard potential, e.g., +1.5 V. The positive offset output voltage +Vos is detected by the offset output voltage detecting circuit 14 and is applied to the base of the second PNP transistor 16. The potential Vp increases over its standard value, e.g., 18 mV, by the positive offset output voltage +Vos. Then, the second PNP transistor 16 is more activated to increase the current Ic16 which flows through the second PNP transistor 16. The voltage V22 across the resistor 22 increases, so that the emitter potential Ve16 of the second PNP transistor 16 rises to approach the standard potential, e.g., +1.5 V. As a result of this operation, the DC level V29 on the second output signal supply terminal 29 automatically rises to approach the standard potential, e.g., +1.5 V according to the increase of the emitter potential Ve16 of the second PNP transistor 16. The emitter potential Ve15 of the first PNP transistor 15 automatically lowers to approach the standard potential, e.g., +1.5 V, inversely to the operation for the second PNP transistor 16 due to the positive offset output voltage +Vos. The DC level V28 on the first output signal supply terminal 28 also automatically lowers to approach the standard potential, e.g., +1.5 V according to the decrease of the emitter potential Ve15 of the first PNP transistor 15. As a result, the positive offset output voltage +Vos arising between the first and second output signal supply terminals 28 and 29 is eliminated.

When the DC level V28 on the first output signal supply terminal 28 is lower than its standard value, e.g., 1.5 V, the DC level V29 on the second output signal supply terminal 29 is above the standard value, e.g., 1.5 V in inverse relation to the DC level V28. Thus, some amount of negative offset output voltage −Vos arises between the first and second output signal supply terminals 28, 29. In this state, the emitter potential Ve15 of the first PNP transistor 15 also is below the standard potential, e.g., +1.5 V, while, the emitter potential Ve16 of the second PNP transistor 16 is above the standard potential, e.g., +1.5 V. The negative offset output voltage −Vos is detected by the offset output voltage detecting circuit 14 and applied to the base of the second PNP transistor 16. The potential Vp decreases below its standard value, e.g., 18 mV by the negative offset output voltage −Vos. Then, the second PNP transistor 16 is less conductive and the current Ic16 is decreased. The voltage V22 across the resistor 22 decreases so that the emitter potential Ve16 of the second PNP transistor 16 lowers to approach the standard potential, e.g., +1.5 V. As a result of this operation, the DC level V29 on the second output signal supply terminal 29 automatically lowers to approach the standard potential, e.g., +1.5 V, according to the decrease of the emitter potential Ve16 of the second PNP transistor 16. The emitter potential Ve15 of the first PNP transistor 15 automatically rises to approach the standard potential, e.g., +1.5 V, inversely to the operation for the second PNP transistor 16 due to the negative offset output voltage −Vos. The DC level V28 on the first output signal supply terminal 28 also automatically rises to approach the standard potential, e.g., +1.5 V according to the increase of the emitter potential Ve15 of the first PNP transistor 15. As a result, the positive offset output voltage −Vos arising between the first output signal supply terminal 28 and 29 is eliminated.

Thus, the offset output voltage detecting circuit 14 is able to eliminate both the positive and negative offset output voltages +Vos and −Vos arising between the first and second output signal supply terminals 28 and 29. The DC levels V28, V29 on the first and second output signal supply terminals 28, 29 are effectively compensated to maintain the same standard potential, e.g., +1.5 V. The offset output voltage detecting circuit 14 is able to detect the negative offset output voltages −Vos, as well as the positive offset output voltages +Vos.

Figure 4:
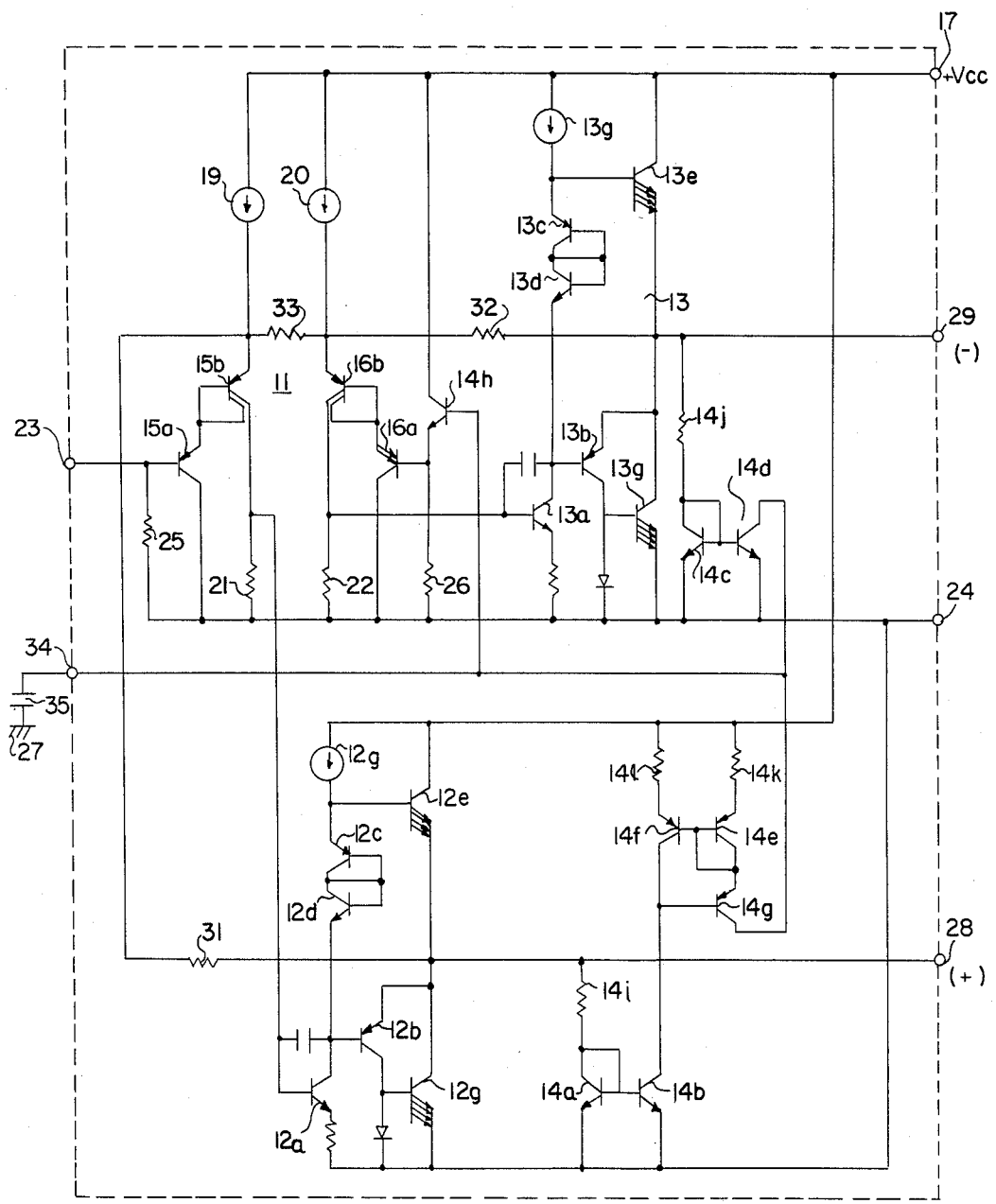
FIG. 4 is a schematic diagram showing a practical circuit arrangement for incorporating the balanced transformer-less amplifier circuit of FIG. 2 into an integrated circuit configuration.

FIG. 4 shows a practical circuit arrangement in the IC configuration for the balanced transformer-less amplifier circuit shown in FIG. 2. As shown in FIG. 4, the preamplifier 11 is comprised of transistors 15a, 15b, 16a and 16b. The transistors 15a and 15b correspond to the first PNP transistor 15 in FIG. 2. The transistors 16a and 16b correspond to the second PNP transistor 16 in FIG. 2. The second PNP transistor 16b has the emitter area two times the emitter area of the first PNP transistor 15a. The first power amplifier 12 is comprised of transistors 12a, 12b, 12c, 12d, 12e and 12f and a current source 12g. The second power amplifier 13 is comprised of transistors 13a, 13b, 13c, 13d, 13e and 13f and a current source 13g. The pair of transistors 12e and 12f of the first power amplifier 12 and the pair of transistors 13e and 13f of the second power amplifier 13 are each coupled to in an SEPP (single ended push pull) amplifier configuration. The base of the transistor 12a of the first power amplifier 12 is coupled to the base of the transistor 15b of the preamplifier 11. The base of the transistor 13a of the second power amplifier 13 is coupled to the transistor 16b of the preamplifier 11.

The offset output voltage detecting circuit 14 is comprised of transistors 14a, 14b, 14c, 14d, 14e, 14f, 14g and 14h. The transistor 14a is coupled to itself in the diode fashion and coupled to the transistor 14b in the current mirror configuration 14ab. Also the transistor 14c is coupled to itself in the diode fashion and coupled to the transistor 14d in the current mirror configuration 14cd. The collectors of the transistors 14a and 14c are coupled to the first and second output signal supply terminals 28, 29 through resistors 14i and 14j, while, the emitters of the transistors 14b and 14d are coupled to each other through the transistors 14e, 14f and 14g. The transistor 14e is coupled to itself in the fashion and coupled to the transistor 14f in the current mirror configuration 14ef. The emitters of the transistors transistor 14e and 14f are coupled to the positive power supply terminal 17 through resistors 14k and 14l, respectively. The collector of the transistor 14e is coupled to the collector of the transistor 14b of the current mirror 14ab through the transistor 14g. The collector of the transistor 14f is coupled to the collector of the transistor 14c of the current mirror 14cd. The base of the transistor 14g is coupled to the connection between the collectors of the transistors 14d and 14f. The connection between the transistors 14d and 14g, i.e., the output terminal of the transistor 14 is coupled to the base of the second PNP transistor 16a through the transistor 14h.

In the above embodiments, the emitter of the second PNP transistor 16 has an area two times larger than that of the first PNP transistor 15. However, the emitter area ratio N may be any amount larger than one, i.e., N>1. When N=2, the base voltage of the second PNP transistor 16 has a value of 18 mV (at a temperature 27° C.), as mentioned above. When N=3, the base voltage of the second PNP transistor 16 has a value of 28.6 mV (at a temperature 27° C.). When N=4, the base voltage of the second PNP transistor 16 has a value of 36 mV (at a temperature 27° C.).

Further, the first and second PNP transistors are different in their emitter current dencities from each other by the diffences of their emitter area. However, these emitter current dencities are able to be differed with each other by that the current source 20 has a current I2 smaller than the current I1 of the current source 19. These emitter current dencities are able to be differed with each other by that the collector load resistor 22 has a resistance R22 larger than the resistance R21 of the collector load resistor 21.

As described above, the present invention can provide an extremely preferable balanced transformer-less amplifier circuit.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A balanced transformer-less amplifier, comprising:
    a pair of power amplifiers connected in parallel for outputting amplified signals of opposite polarity;
    offset output detection means coupled to the amplifiers for detecting the difference in voltage level between the outputs of the two power amplifiers; and
    preamplifier means responsive to the offset output detection means both for operating the pair of power amplifiers on only a single power source voltage and for compensating for the difference in voltage level between the outputs of the two power amplifiers.

2. The amplifier of claim 1 wherein the preamplifier means includes a pair of differentially connected transistors, one transistor connected to the offset output detection means having an emitter current density smaller than the emitter current density of the other transistor.

3. The balanced transformer-less amplifier of claim 2 wherein the one transistor connected to the offset output detection means has an emitter area greater than the other transistor.

4. The balanced transformer-less amplifier of claim 3 wherein each transistor is a PNP transistor.

5. The balanced transformer-less amplifier of claim 4 wherein each transistor has an emitter-collector path connected for receiving the single power source voltage.

6. The balanced transformer-less amplifier of claim 3 wherein the ratio of the larger emitter area to the smaller emitter area is at least 2:1.

7. The balanced transformer-less amplifier of claim 2 wherein the preamplifier includes a pair of current sources each corresponding to one of the transistors, the current source corresponding to the transistor connected to the offset output detection means having a current smaller than the current of the other current source.

8. The balanced transformer-less amplifier of claim 2 wherein the preamplifier includes a pair of collector load resistor means each corresponding to one of the transistors the collector load resistor means corresponding to the transistor connected to the offset output detection means having a resistance larger than the resistance of the other collector load resistor means.

9. The balanced transformer-less amplifier of claim 2 wherein the power amplifiers are non-inversed type, the input of each power amplifier is connected to a corresponding one of the transistors, and the output of each power amplifier is coupled to the opposite transistor.

10. The balanced transformer-less amplifier of claim 2 wherein the power amplifiers are inversed type, the input of each power amplifier is connected to a corresponding one of the transistors, and the output of each power amplifier is coupled to the same corresponding transistor.

* * * * *